(12) United States Patent
Song et al.

(10) Patent No.: US 7,980,715 B2
(45) Date of Patent: Jul. 19, 2011

(54) BACKLIGHT UNIT AND METHOD FOR MANUFACTURING THE SAME

(75) Inventors: Hong Sung Song, Gumi-si (KR); Byung Jin Choi, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 146 days.

(21) Appl. No.: 12/411,089

(22) Filed: Mar. 25, 2009

(65) Prior Publication Data

US 2009/0185365 A1 Jul. 23, 2009

(51) Int. Cl.
*G09F 13/08* (2006.01)
*F21V 7/04* (2006.01)
*F21S 4/00* (2006.01)

(52) U.S. Cl. .................. 362/97.1; 362/631; 362/225

(58) Field of Classification Search .......... 362/630–634, 362/97.1, 97.2, 614, 221, 225, 217.3
See application file for complete search history.

(56) References Cited

U.S. PATENT DOCUMENTS

| | | | | |
|---|---|---|---|---|
| 4,736,275 | A * | 4/1988 | Kendall et al. | 361/767 |
| 6,991,960 | B2 * | 1/2006 | Howarth | 438/106 |
| 7,084,353 | B1 * | 8/2006 | Downes | 174/261 |
| 7,292,519 | B2 * | 11/2007 | Tatsuno et al. | 369/120 |
| 2006/0286831 | A1 * | 12/2006 | Kwon et al. | 439/108 |
| 2007/0091065 | A1 * | 4/2007 | Misek | 345/157 |
| 2007/0189041 | A1 * | 8/2007 | Chen et al. | 362/631 |
| 2008/0180947 | A1 * | 7/2008 | Jang et al. | 362/225 |
| 2008/0284941 | A1 * | 11/2008 | Choi et al. | 349/62 |

FOREIGN PATENT DOCUMENTS

| | | |
|---|---|---|
| CN | 1747628 | 3/2006 |
| CN | 1881030 A | 12/2006 |
| JP | 02129991 A * | 5/1990 |

OTHER PUBLICATIONS

Office Action issued in corresponding Chinese Patent Application No. 200810174009.9; issued Jul. 30, 2010.
Office Action issued in corresponding Chinese Patent Application No. 200810174009.9; issued Oct. 16, 2009.

* cited by examiner

*Primary Examiner* — Jong-Suk (James) Lee
*Assistant Examiner* — David R Crowe
(74) *Attorney, Agent, or Firm* — Brinks Hofer Gilson & Lione

(57) ABSTRACT

Disclosed are a backlight unit capable of determining a deviated degree of a lamp grip by a guide line formed adjacent to the lamp grip a PCB that connects an electrode thereof with a lamp electrode, and a manufacturing method for the same. The manufacturing method includes preparing a case structure, a plurality of lamps equipped with an electrode at both ends, and fastening units corresponded to the electrodes of the lamps, preparing a PCB constituted by a base substrate and a signal line formed on the base substrate, and defined with positions thereon for forming the fastening units having electric connection parts with respect to the signal line, and positioning the PCB in the case structure, forming a solder layer at the electric connection parts on the PCB by applying a soldering material using a solder mask, and forming a guide pattern at both sides of the fastening unit, connecting the fastening units with the solder layers while using the guide patterns as marks, and connecting the lamps to the fastening units.

6 Claims, 5 Drawing Sheets

BACKLIGHT UNIT AND METHOD FOR MANUFACTURING THE SAME

The present application is related to Korean Patent Application No. 10-2007-114793, filed on Nov. 12, 2007, which is hereby incorporated by reference as if fully set forth herein.

BACKGROUND OF THE INVENTION

1. Field of the Invention

The present invention relates to a backlight unit, and more particularly, to a backlight unit in an electrode PCB structure, capable of determining a deviated degree of a lamp grip by a guide line formed adjacent to the lamp grip on the PCB that connects an electrode thereof with a lamp electrode, and a manufacturing method for the same.

2. Discussion of the Related Art

A cathode ray tube (CRT), one type of generally utilized displaying devices, is applied mainly to monitors of TVs, measuring equipments, information terminals and the like. Recently, however, because the CRT has such great weight and size, it has been going out of date due to the tendency toward compact and lightweight electronic products.

Since the ability to reduce the size and weight of a CRT is limited, various technologies for replacing the CRT have been developed, including a liquid crystal display (LCD) using the electric-field effect and the optical effect, a plasma display panel (PDP) using a gas discharge, an electro-luminescence display (ELD) using the electro-luminescence effect and the like. The LCD among the above devices is being actively researched.

Because it is compact, lightweight, and economical in power consumption, the LCD is being actively researched and developed as a substitute for the CRT. Accordingly, now being competent to serve as a flat panel display, the LCD is applied to monitors of a desk-top computer as well as a laptop computer, and huge-size information displays. Thus, the demand for the LCD is continuously increasing.

Most of the LCDs are light receiving types that display an image by adjusting luminosity of an incident light from the outside. Therefore, in order to project light to an LCD panel, the LCD is necessarily equipped with a dedicated light source such as a backlight unit.

In general, the backlight unit used as a light source of the LCD is divided largely into an edge type and a direct type, in accordance with the arrangement of cylindrical light emitting lamps.

In the edge-type backlight unit, a lamp unit is mounted to a side edge of a light guide plate that guide light. More particularly, the lamp unit comprises a light emitting lamp, a lamp holder inserted in both ends of the lamp to protect the lamp, and a lamp reflection plate enclosing an outer circumference of the lamp, being inserted in a lateral side of the light guide plate by one side thereof so as to reflect the light emitted from the lamp toward the light guide plate.

Usually, the above-structured edge-type backlight unit wherein the lamp unit is formed at the side edge of the light guide plate is applied to relatively small LCDs such as monitors of a laptop computer and a desktop computer. The edge-type backlight unit has excellent uniformity of light and durability, and is advantageous to implement such thin LCDs.

On the other hand, the development of direct-type backlight unit has been concentrated since the appearance of a large LCD over 20 inches. The direct-type backlight unit is structured in a manner that a plurality of lamps are linearly arranged on a lower surface of a diffusion plate to directly illuminate the whole surface of the LCD panel.

Having a higher light use efficiency than the edge type, the direct type is mainly used in a large-size LCD which requires high brightness.

In addition, the direct type can apply a variety of methods for applying voltage signals for driving the respective lamps.

Hereinafter, a backlight unit according to the conventional art will be described with reference to the accompanying drawing.

FIG. 1 is a plan view of the conventional backlight unit.

Referring to FIG. 1, the backlight unit comprises a case structure 1 and a plurality of lamps 2 arranged in the case structure 1 at constant parallel intervals. A voltage applying line 4 is provided to both ends of each lamp 2 and connected to a lamp driving unit 5 mounted at the outside. In this case, electrodes disposed at both ends of the lamp 2 are connected with the voltage applying lines 4 by soldering. However, since at least twice as many voltage applying lines 4 as the number of the lamps 2 are necessary, soldering may be insufficient to perfectly connect the lamp electrodes with the voltage applying lines 4 without a short circuit. Therefore, the structure needs to be improved. In this example, a rubber holder 3 is applied to the both electrodes of the lamp 2.

Recently, it has been suggested that the lamp electrodes and driving signal applying parts are in the form of an electrode PCB and corresponded to the plurality of lamp electrodes in order to minimize the soldering process and the voltage applying lines.

The above conventional direct-type backlight unit have some problems as follows.

Since at least twice as many voltage applying lines as the number of the lamps are required, the soldering connection may cause a short circuit. Therefore, the structural improvement is necessitated.

To reduce the soldering process and minimize the number of the voltage applying lines, the electrodes of the lamps and the driving signal applying part have been changed to the electrode PCB form to be are corresponded to the plurality of lamp electrodes. However, because the electrode PCB is separately manufactured from the lamp, the shape of a connection part with the lamp is hard to correctly correspond to the lamp and even subject to distortion. Furthermore, when the connection part of the electrode PCB, as partially distorted, is connected with the lamp, the lamp may be continuously applied with an external force and therefore even deformed or broken. To this end, it is required to minimize distortion between the lamp and the connection part of the PCB electrode.

SUMMARY

A backlight unit comprises: a case structure holding a receiving space therein, a printed circuit board (PCB) disposed at both ends in the case structure and equipped with a plurality of fastening units, a plurality of lamps connected to the plurality of fastening units of the PCB, and equipped with electrodes at both ends thereof, and a guide pattern arranged parallel with a direction in which the fastening units are extended on a surface of the PCB, at an interval from the fastening units.

In one embodiment, the plurality of fastening units are formed in a longitudinal direction of the lamps, and each comprises: a plane part formed on the PCB in the extending direction of the fastening units; and a grip part protruded upward from the plane part, in the form of a grip shaped corresponding to the lamp to contact the both electrodes of the lamp.

In another aspect, a manufacturing method for a backlight unit comprises: preparing a case structure having a receiving space therein, a plurality of lamps arranged in the case structure and equipped with an electrode at both ends, and fastening units respectively corresponded to the electrodes of the lamps; preparing a PCB constituted by a base substrate and a signal line formed on the base substrate, and defined with positions thereon for forming the fastening units having electric connection parts with respect to the signal line, and positioning the PCB at both ends in the case structure; forming a solder layer at the electric connection parts on the PCB by applying a soldering material using a solder mask, and forming a guide pattern at both sides of the fastening unit forming positions; connecting the fastening units with the solder layers while using the guide patterns as marks; and connecting the lamps to the fastening units. Here, when using the guide patterns as marks, a deviation angle between the fastening units and the guide pattern is determined using a quantification device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, a backlight unit and a manufacturing method for the same will be described in great detail.

Figure 1:
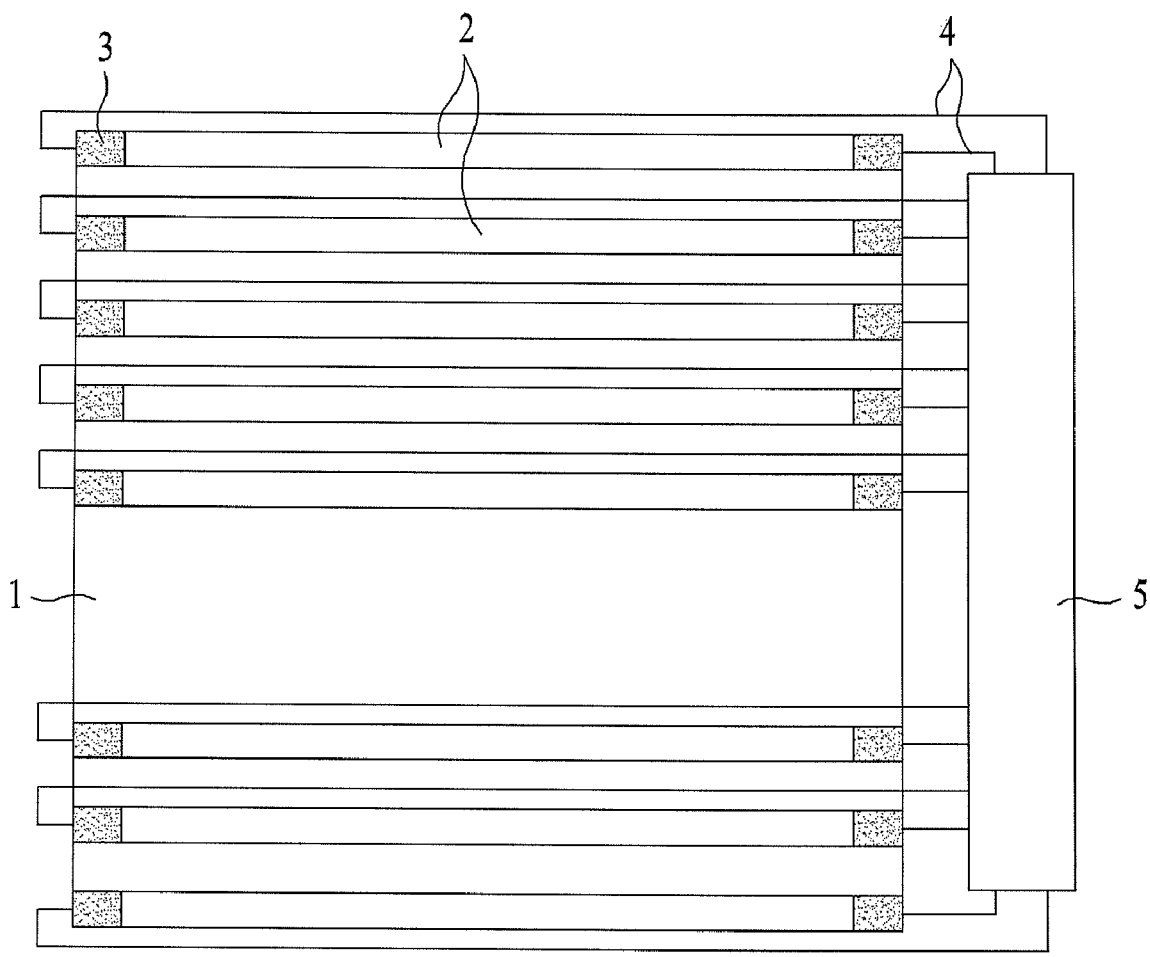
FIG. 1 is a plan view showing a backlight unit according to the conventional art.
Figure 2:
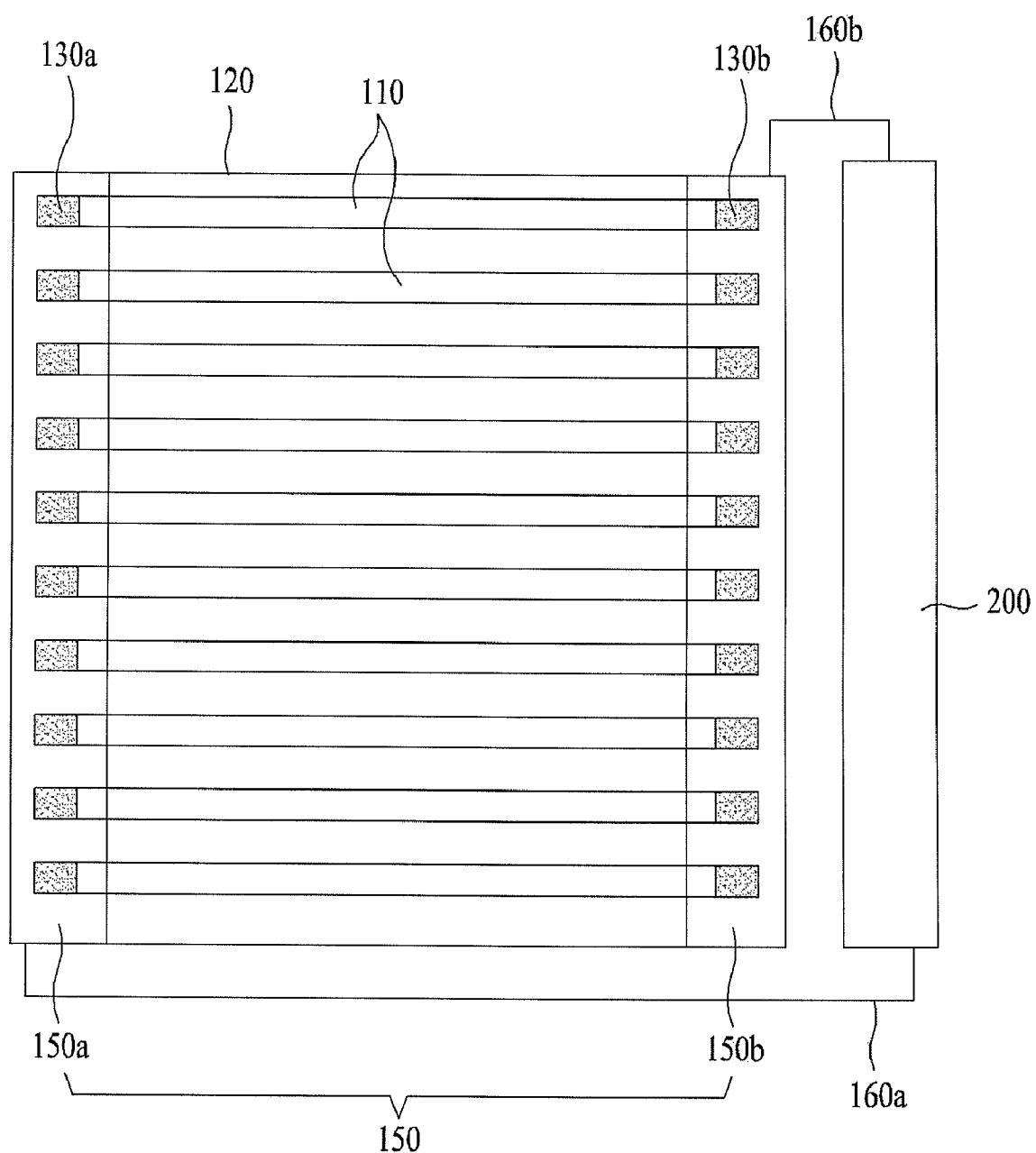
FIG. 2 is a plan view of a backlight unit according to an embodiment of the present invention.
Figure 3:
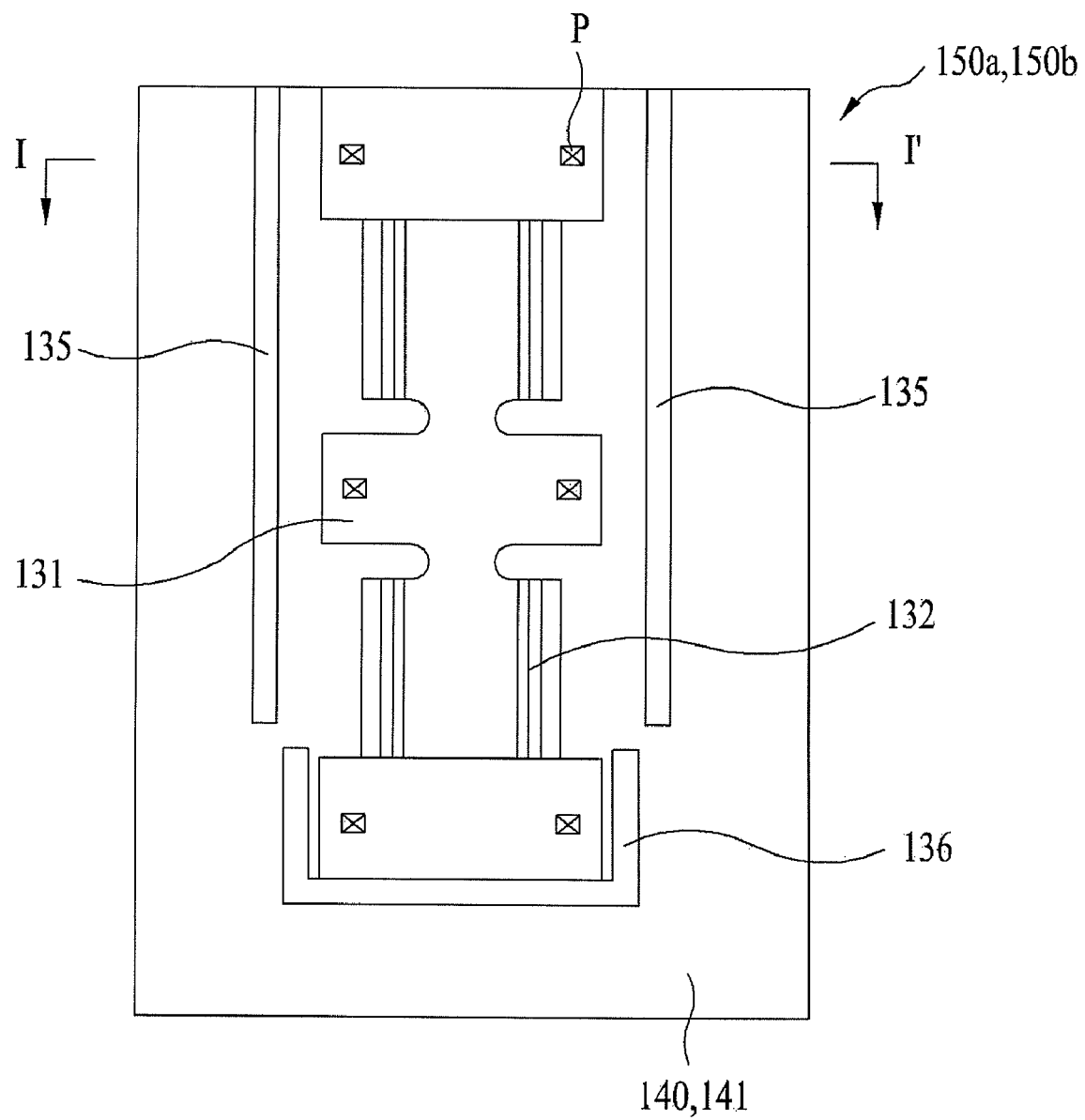
FIG. 3 is a plan view of a PCB corresponding to an electrode of one of the lamps shown in FIG. 2.
Figure 4:
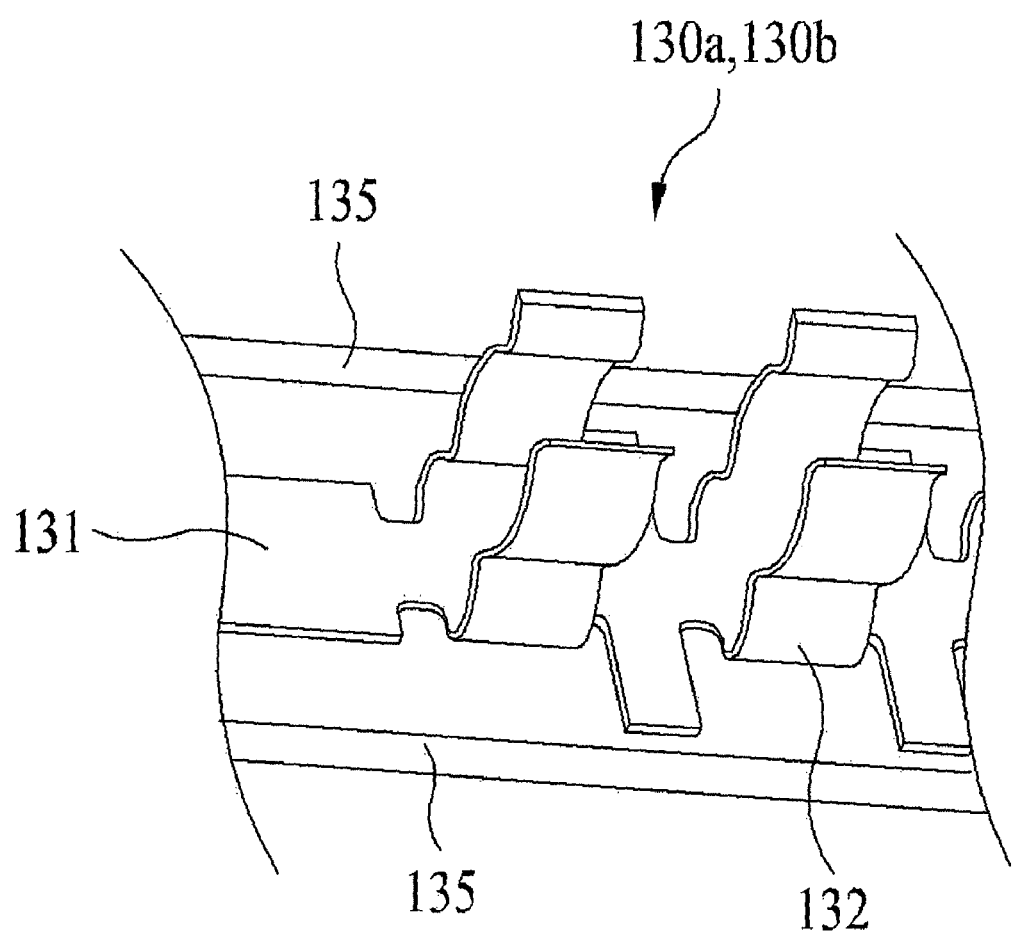
FIG. 4 is a perspective view of FIG. 3.
Figure 5:
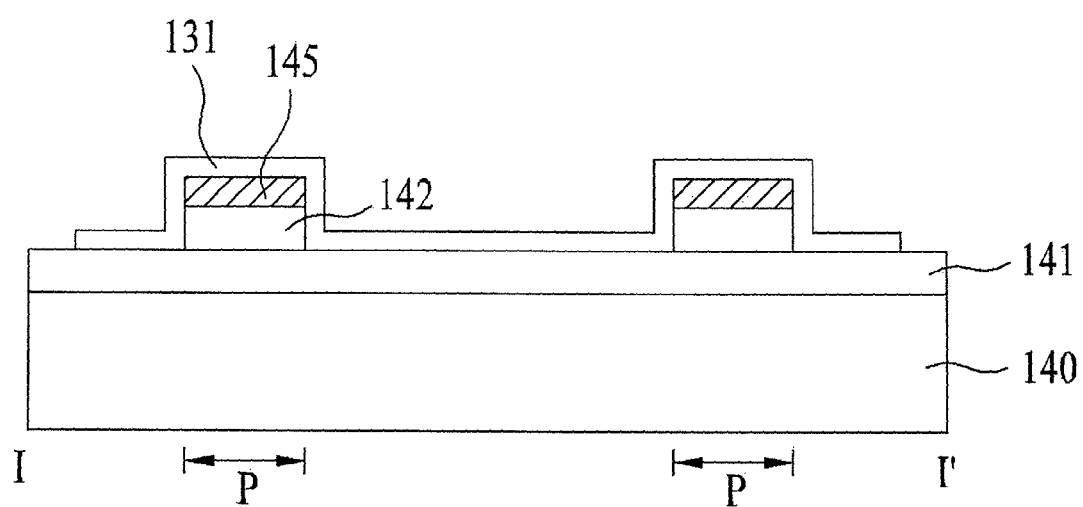
FIG. 5 is a sectional view of FIG. 3, cut along a line I-I'.

FIG. 2 is a plan view of a backlight unit according to an embodiment of the present invention. FIG. 3 is a plan view of a PCB corresponding to an electrode of one of the lamps shown in FIG. 2. FIG. 4 is a perspective view of FIG. 3, and FIG. 5 is a sectional view of FIG. 3 cut along a line I-I'.

Referring to FIG. 2, the backlight unit according to the embodiment of the present invention has a direct-type structure in which a plurality of lamps are arranged in parallel. Electrodes formed at both ends of each lamp are fixed to electrode PCBs 150a and 150b (collectively referred to as 150). Signals are applied to the electrodes through the electrode PCB 150.

The backlight unit comprises a plurality of lamps 110 arranged in parallel at intervals, each having electrodes at both ends thereof, and the electrode PCBs 150a and 150b including fastening units 130a and 130b, respectively, in the form of a grip for connecting the electrodes of the lamps 110. The electrode PCBs 150a and 150b are arranged at both sides of each of the lamps 110 across the longitudinal direction of the lamps 110. In addition, a case structure 120 is configured to house the PCB 150 and the plurality of lamps 110 therein.

Additionally, the electrode PCBs 150a and 150b are connected to a lamp driving unit 200 mounted at the outside through power voltage applying lines 160a and 160b, respectively. As shown in the drawings, the power voltage applying lines 160a and 160b may be provided corresponding to the electrode PCBs 150a and 150b one to one so as to apply common voltage signals. Alternatively, when individual driving of the lamps is necessary, a plurality of voltage applying lines may be provided to each lamp 110 and connected to the lamp driving unit 200. In the latter case as well, signal applying lines built in the electrode PCB 150 can be structured in a simple manner. Therefore, the line forming process can be performed as simple as the process for forming the general common voltage applying lines.

As shown in FIG. 3 and FIG. 4, the fastening units 130a and 130b for fixing the both ends of the lamp 110 each comprise a plane part 131 formed in the longitudinal direction of the lamp 110, and a grip part 132 protruded from the plane part 131 upward, that is, in a lamp connecting direction and shaped to grip the lamp 110. More specifically, as shown in the drawings, the grip part 132 may have a vertical sectional shape in which circular convex and concave lines are repeated symmetrically at both sides. As another example, the grip part 132 may have a U-shape of which ends for holding the lamp 110 are a bit narrower. Alternatively, the grip part 132 may be asymmetrically shaped with respect to a vertical direction, more specifically, such that one side thereof for holding the lamp 110 is shorter while the other side is longer. In any case, the grip part 132 has a shape, even partially, corresponding to a circular surface of the lamp 110 to achieve contact with the electrode of the lamp 110.

In addition, the plane part 131 is in connection with the grip part 132 as if extending in the longitudinal direction of the lamp 110 in the form of a line having a predetermined width different from the width of the grip part 132. That is, the plane part 131 may be extended outward more than the grip part 132, and may partially include an uneven surface.

The grip part 132 and the plane part 131 are integrally formed with each other, and both are connected to pads P formed at the electrode PCB 150a and 150b to be applied with the voltage signals.

Additionally, a guide pattern 135 formed respectively on the electrode PCB 150a and 150b at an interval from the fastening unit 130a and 130b, in the shape of a line parallel with the lamp 110. The guide pattern 135 is manufactured during soldering of the pads P contacting the plane part 131 of the fastening units 130a and 130b for electric connection with a signal line 142 (FIG. 5) built in the electrode PCBs 150a and 150b. Accordingly, the guide pattern 135 contains cured solder.

A reference symbol 136 denotes a reference terminal formed corresponding to the fastening unit 130a and 130b of the lamp 110, which is generated while a silk line is formed in a surface mount technology (SMT) that designates positions on the electrode PCBs 150a and 150b or forms line numbers.

As shown in FIG. 5, the electrode PCB 150 comprises a protection layer 141 formed on a base substrate 140, and the signal line 142 disposed at a predetermined part on an upper part of the protection layer 141 to transmit driving signals to the electrodes formed at the both ends of the lamp 110. Here, the protection layer 141 is dispensable and therefore can be omitted.

A soldering process is performed to a part of the signal line 142, using a solder mask (not shown) having opening parts corresponding to the pads P. On the solder mask, an opening part may be additionally formed corresponding to the guide pattern 135. Accordingly, during the soldering process wherein the solder mask is corresponded to the electrode PCBs 150a and 150b, a solder layer 145 and the guide pattern 135 can be created together.

Next, when the solder layer 145 of the pad P is corresponded to the fastening units 130a and 130b, the guide patterns 135 function as a mark so that the fastening units 130a and 130b are positioned parallel with the guide patterns 135 and connected to the solder layer 145.

Here, the guide patterns 135 arranged parallel with the longitudinal direction of the lamp 110 are formed on the electrode PCB 150 prior to the lamp 110. Therefore, considering that the electrode PCBs 150a and 150b are vertically positioned at both sides of the case structure 120 and the lamps 110 are arranged horizontally across the electrode PCBs 150a and 150b, the guide patterns 135 are also horizontally formed across the longitudinal direction of the electrode PCBs 150a and 150b.

The guide pattern 135 has about 0.3 mm width, and is spaced apart from ends of the plane part 131 of the fastening units 130a and 130b by about 0.2 mm.

Therefore, the lamp 110 is disposed corresponding to the guide patterns 135 formed on the electrode PCB 150.

Hereinafter, the process of manufacturing the backlight unit described with FIG. 3 to FIG. 5 will be explained in detail.

First, the case structure 120 holding a receiving space is prepared. The plurality of the lamps 110 equipped with the electrodes at both ends are arranged in the case 120, and the fastening units 130a and 130b are prepared corresponding to the electrodes of the lamp 110.

In addition, the electrode PCBs 150 comprising the base substrate 140 and the signal line 142 formed on the base substrate 140 are prepared. On the electrode PCB 150, the reference terminal 136 (FIG. 3) is formed to define the position of the fastening units 130a and 130b each having an electric connection part with the signal line 142.

The electrode PCBs 150 are disposed at both ends in the case structure 120.

Next, the soldering process is performed by applying a soldering material, using the solder mask (not shown) having the opening parts corresponding to upper and lower both sides of the electric connection parts and the fastening units 130a and 130b. Accordingly, the solder layers 145 are formed at the electric connection parts on the electrode PCBs 150, and the guide patterns 135 are formed at both sides of the fastening units 130a and 130b.

Next, the fastening units 130a and 130b are connected with the solder layers 145 by using the guide patterns 135 as marks. During this process, a deviation angle between the fastening units 130a and 130b and the guide patterns 135 can be recognized by naked eyes or a quantification device. When the deviation angle is relatively minor, the fastening units 130a and 130b are connected to the electrode PCB 150 ignoring the deviation angle. When the deviation angle is great, the fastening units 130a and 130b are separated from the electrode PCB 150 and repaired.

Next, the lamps 110 are connected to the fastening units 130a and 130b.

The above-described backlight unit and the manufacturing method for the same according to the embodiment of the present invention have the following advantages.

During construction of the backlight unit, when performing soldering of an electrode PCB, lamp guide patterns are dedicatedly formed in addition to a solder layer for connection with a signal line. Therefore, a deviated degree of fastening units which enclose lamps can be determined in advance before connecting the lamps.

Furthermore, while determining the deviation of the fastening units, connection of the fastening units can be simultaneously performed. Accordingly, wrong positioning of the lamps can be prevented.

As a consequence, in the process of electrically connecting the fastening unit with the electrode PCBs, the fastening units can be disposed at their correct positions, and accordingly deformation or breakage of the lamps can be prevented.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A backlight unit comprising:
a case structure defining a receiving space therein;
a printed circuit board (PCB) disposed at both ends in the case structure and equipped with a plurality of fastening units;
a plurality of lamps connected to the plurality of fastening units of the PCB, and equipped with electrodes at both ends thereof; and
a guide pattern arranged parallel with a direction in which each fastening unit extends on a surface of the PCB, at an interval from the fastening units, wherein the guide pattern is made of a solder material when forming solder electrodes of the PCB.

2. The backlight unit according to claim 1, wherein the plurality of fastening units are disposed in a longitudinal direction of the lamps, and each comprises:
a plane part disposed on the PCB in the extending direction of the fastening units; and
a grip part protruded upward from the plane part, in the form of a grip shape corresponding to the lamp to contact the electrodes of the lamp.

3. The backlight unit according to claim 1, wherein the PCB and the plurality of fastening units are provided with electric connection parts.

4. The backlight unit according to claim 3, wherein the PCB comprises:
a base substrate;
a signal line disposed on the base substrate; and
said solder electrodes comprising a solder layer disposed on the signal line corresponding to the electric connection parts.

5. A manufacturing method for a backlight unit, comprising:
preparing a case structure having a receiving space therein, a plurality of lamps arranged in the case structure and equipped with an electrode at both ends, and fastening units respectively corresponded to the electrodes of the lamps;
preparing a PCB constituted by a base substrate and a signal line formed on the base substrate, and defined with positions thereon for forming the fastening units having electric connection parts with respect to the signal line, and positioning the PCB at both ends in the case structure;
forming a solder layer at the electric connection parts on the PCB by applying a soldering material using a solder mask, and forming a guide pattern at both sides of the fastening unit forming positions with the same solder material and said solder mask;
connecting the fastening units with the solder layers while using the guide patterns as marks; and
connecting the lamps to the fastening units.

6. The manufacturing method according to claim 5, wherein, when using the guide patterns as marks, a deviation angle between the fastening units and the guide pattern is determined using a quantification device.

* * * * *